(12) United States Patent
Meinhardt et al.

(10) Patent No.: US 10,985,291 B2
(45) Date of Patent: Apr. 20, 2021

(54) RADIATION-HARD HIGH-SPEED PHOTODIODE DEVICE

(71) Applicant: ams International AG, Rapperswil (CH)

(72) Inventors: Gerald Meinhardt, Graz (AT); Ewald Wachmann, Kainbach (AT); Martin Sagmeister, Graz (AT); Jens Hofrichter, Gattikon (CH)

(73) Assignee: AMS INTERNATIONAL AG, Rapperswil (CH)

( * ) Notice: Subject to any disclaimer, the term of this patent is extended or adjusted under 35 U.S.C. 154(b) by 0 days.

(21) Appl. No.: 16/464,806

(22) PCT Filed: Nov. 28, 2017

(86) PCT No.: PCT/EP2017/080674
§ 371 (c)(1),
(2) Date: May 29, 2019

(87) PCT Pub. No.: WO2018/104111
PCT Pub. Date: Jun. 14, 2018

(65) Prior Publication Data
US 2019/0319156 A1    Oct. 17, 2019

(30) Foreign Application Priority Data

Dec. 5, 2016    (EP) .................................... 16202201

(51) Int. Cl.
*H01L 27/146*    (2006.01)
*H01L 31/118*    (2006.01)
(Continued)

(52) U.S. Cl.
CPC ........ *H01L 31/118* (2013.01); *H01L 27/1463* (2013.01); *H01L 27/14607* (2013.01);
(Continued)

(58) Field of Classification Search
CPC ............. H01L 27/1443; H01L 27/1446; H01L 27/14607; H01L 27/1463; H01L 27/14636;
(Continued)

(56) References Cited

U.S. PATENT DOCUMENTS 6,690,074 B1    2/2004    Dierickx et al.
6,690,078 B1 *  2/2004    Irissou ................. H01L 31/105
                                                            257/458
(Continued)

FOREIGN PATENT DOCUMENTS

CN        105190260 A    12/2015
EP           1241710      9/2002
(Continued)

OTHER PUBLICATIONS

European Patent Office, International Search Report for PCT/EP2017/080674 dated Mar. 2, 2018.
(Continued)

*Primary Examiner* — Stephen W Smoot
(74) *Attorney, Agent, or Firm* — MH2 Technology Law Group LLP

(57) ABSTRACT

The photodiode device comprises a substrate (1) of semiconductor material with a main surface (10), a plurality of doped wells (3) of a first type of conductivity, which are spaced apart at the main surface (10), and a guard ring (7) comprising a doped region of a second type of conductivity, which is opposite to the first type of conductivity. The guard ring (7) surrounds an area of the main surface (10) including the plurality of doped wells (3) without dividing this area. Conductor tracks (4) are electrically connected with the doped wells (3), which are thus interconnected, and further conductor tracks (5) are electrically connected with a region of the second type of conductivity. A doped surface region
(Continued)

(2) of the second type of conductivity is present at the main surface (10) and covers the entire area between the guard ring (7) and the doped wells (3).

16 Claims, 3 Drawing Sheets

(51) Int. Cl.
*H01L 31/0352* (2006.01)
*H01L 31/115* (2006.01)
*H01L 31/0224* (2006.01)
*H01L 31/103* (2006.01)

(52) U.S. Cl.
CPC .. *H01L 27/14636* (2013.01); *H01L 27/14659* (2013.01); *H01L 27/14663* (2013.01); *H01L 31/022408* (2013.01); *H01L 31/03529* (2013.01); *H01L 31/103* (2013.01); *H01L 31/115* (2013.01)

(58) Field of Classification Search
CPC ......... H01L 27/14658; H01L 27/14659; H01L 27/14663; H01L 31/022408; H01L 31/03529; H01L 31/103; H01L 31/115; H01L 31/118

See application file for complete search history.

(56) References Cited

U.S. PATENT DOCUMENTS

| | | | |
|---|---|---|---|
| 6,753,586 B1 | 6/2004 | Holcombe | |
| 9,219,184 B2* | 12/2015 | Huang | .............. H01L 31/02241 |
| 2002/0066860 A1 | 6/2002 | Possin | |
| 2005/0253132 A1* | 11/2005 | Marshall | ........... H01L 27/14643 257/24 |
| 2007/0111343 A1* | 5/2007 | Kindem | .............. H01L 27/1446 438/21 |
| 2009/0309144 A1* | 12/2009 | Park | .................... H01L 27/1463 257/292 |
| 2010/0245809 A1* | 9/2010 | Andreou | ........... H01L 27/14603 356/222 |
| 2015/0287847 A1 | 10/2015 | Teva | |
| 2015/0311377 A1* | 10/2015 | Tsai | .................. H01L 27/1461 257/463 |
| 2016/0025558 A1 | 1/2016 | Dierschke et al. | |
| 2016/0211402 A1* | 7/2016 | Joo | .................. H01L 31/03529 |
| 2019/0165010 A1* | 5/2019 | Raynor | ................. H01L 31/103 |
| 2020/0127023 A1* | 4/2020 | Geske | ............... H01L 31/02005 |

FOREIGN PATENT DOCUMENTS

| | | |
|---|---|---|
| EP | 1677353 | 7/2006 |
| WO | 2006/131209 | 12/2006 |

OTHER PUBLICATIONS

Battaglia, M. et al., "Development of a radiation hard CMOS monolithic pixel sensor", Nuclear Sci. Symposium Conference Record, NSS '08. IEEE, No. pp. 3501-3504 19-25 (Oct. 2008).

Loukianova, N.V. et al., "Leakage Current Modeling of Test Structures for Characterization of Dark Current in CMOS Image Sensors", IEEE Transactions on Electron Devices, vol. 50(1), (2003).

Taiwanese Examination Report in corresponding Taiwanese Application No. 106138130 dated Jun. 19, 2018, 11 pages.

* cited by examiner

RADIATION-HARD HIGH-SPEED PHOTODIODE DEVICE

BACKGROUND OF THE INVENTION

Computed tomography makes use of x-rays to generate a three dimensional picture of solid objects, e.g. the human body. A scintillator transforms the x-rays into visible light, which is then detected with the help of an array of photodiodes. The photodiodes can be connected with a CMOS circuit by wafer-to-wafer bonding, by flip-chip assembly of semiconductor chips, or by monolithic integration of CMOS components and photodiodes in the same semiconductor device. A monolithic integration provides the best interconnection between photodiodes and CMOS circuitry, but semiconductor material that is suitable for CMOS circuits may cause difficulties in integrating photodiodes with respect to low leakage current, low capacitance, high sensitivity, short response time, and radiation hardening simultaneously. Moreover, a low temperature coefficient of the responsivity poses a challenge for CMOS compatible photodiodes; a requirement that could not be met by state-of-the-art.

WO 2006/131209 A2 discloses a photodiode with integrated semiconductor circuit. The photodiode is formed as a layered structure by means of waferbonding. The circuit is connected to the diode by contacts penetrating the semiconductor body.

U.S. Pat. No. 6,690,074 B1 discloses a semiconductor device structure for reducing the current flow that is caused by incident ionizing radiation. It comprises a p-substrate, an $n^+$-doped surface region within an n-well, and a $p^+$-doped guard ring for obstructing radiation-induced parasitic current flow between the n-well and n-doped regions of further semiconductor devices that are located in the neighborhood of the n-well.

US 2015/0287847 A1 discloses a photodiode device with reducible space charge region. The device comprises a doped region contiguous with a contact region of the same conductivity type located at the substrate surface, an appertaining anode or cathode connection, a further contact region of an opposite conductivity type at the substrate surface, and a further anode or cathode connection. A lateral pn junction is formed at the substrate surface by a boundary of one of the contact regions. A field electrode is arranged above the lateral pn junction, separated from the lateral pn junction by a dielectric material, and is provided with a further electrical connection separate from the anode and cathode connections, for the purpose of reducing the dark current by reducing the space charge region at the surface.

N. V. Loukianova et al., "Leakage Current Modeling of Test Structures for Characterization of Dark Current in CMOS Image Sensors", IEEE Transactions on Electron Devices vol. 50(1), pages 77 to 83, 2003, describe a photodiode comprising an n-well that is surrounded by a p-well in order to reduce the dark current. The lateral pn junction is passivated by a shallow $p^+$ implant, reducing the width of the space charge region at the surface by one half.

M. Battaglia et al., "Development of a Radiation Hard CMOS Monolithic Pixel Sensor", 2008 IEEE Nuclear Science Symposium Conference Record, pages 3501 to 3504, describe a CMOS monolithic pixel sensor prototype aimed at a superior radiation tolerance. The layouts of pixels of an array of photodiodes include an n-well diode enclosed by a floating $p^+$ guard-ring, thin oxide layers over the diode, and a polysilicon ring covering the region around the n-well.

Whereas prior art fulfills the requirements for low-leakage and/or low capacitance, simultaneously matching high speed and low temperature coefficient of the responsivity remained an unsolved challenge. Furthermore, monolithic integration of the photodiode with CMOS circuitry promises a cost-effective way of manufacturing such devices.

SUMMARY OF THE INVENTION

The radiation-hard high-speed photodiode device comprises a substrate of semiconductor material with a main surface, a plurality of doped wells of a first type of conductivity, spaced apart at the main surface, a guard ring comprising a doped region of a second type of conductivity, which is opposite to the first type of conductivity, conductor tracks electrically connected with the doped wells, and further conductor tracks electrically connected to a region of the second type of conductivity. The conductor tracks interconnect the doped wells. The guard ring surrounds an area of the main surface that includes the plurality of doped wells, without dividing this area. A doped surface region of the second type of conductivity is present at the main surface and covers the entire area between the guard ring and the doped wells.

In an embodiment of the photodiode device, the further conductor tracks are electrically connected with the doped surface region.

A further embodiment comprises a boundary region of the guard ring, the boundary region comprising the second type of conductivity, and a core region of the guard ring arranged inside the boundary region, the core region comprising the first type of conductivity.

A further embodiment comprises a metal layer arranged along the guard ring, and contact plugs of the metal layer contacting the guard ring. The further conductor tracks are connected to the metal layer.

In a further embodiment the contact plugs of the metal layer contact the boundary region and the core region.

In a further embodiment the conductor tracks and the further conductor tracks are arranged parallel to one another and in alternating sequence.

A further embodiment comprises contact regions arranged at the main surface within the doped wells, the contact regions having a doping concentration that is higher than the doping concentration of the doped wells, and contact plugs connecting the conductor tracks with the contact regions.

A further embodiment comprises further contact plugs arranged on the doped surface region in the vicinity of the doped wells. The further contact plugs are connected to the further conductor tracks. Each distance between one of the contact plugs and the further contact plug that is nearest to said contact plug is smaller than the distance between the conductor track connected with said contact plug and the further conductor track connected with said further contact plug.

A further embodiment comprises a peripheral conductor track. The conductor tracks are connected with the peripheral conductor track.

In a further embodiment the first type of conductivity is n-type conductivity and the second type of conductivity is p-type conductivity. The peripheral conductor track is provided as a cathode terminal, and the further conductor tracks are provided as an anode terminal.

A further embodiment comprises a dielectric on or above the main surface. The conductor tracks and the further conductor tracks are embedded in the dielectric.

In a further embodiment the substrate comprises a semiconductor body and an epilayer grown on the semiconductor body, and the main surface is formed by a surface of the epilayer.

In a further embodiment the epilayer is doped for the second type of conductivity. The doped surface region is formed within the epilayer and has a doping concentration that is higher than the doping concentration of the epilayer.

In a further embodiment the plurality of doped wells is provided for one pixel of an array of pixels, and the pixels of the array are separated by the guard ring.

In a further embodiment the conductor tracks are interconnected for each pixel separately, and the further conductor tracks are interconnected for all pixels of the array in common.

A further embodiment comprises a plurality of ring-shaped doped wells of the second type of conductivity, each of the ring-shaped doped wells laterally surrounding one of the doped wells.

The following is a more detailed description of embodiments of the radiation-hard high-speed photodiode device in conjunction with the appended figures.

DETAILED DESCRIPTION

Figure 1:
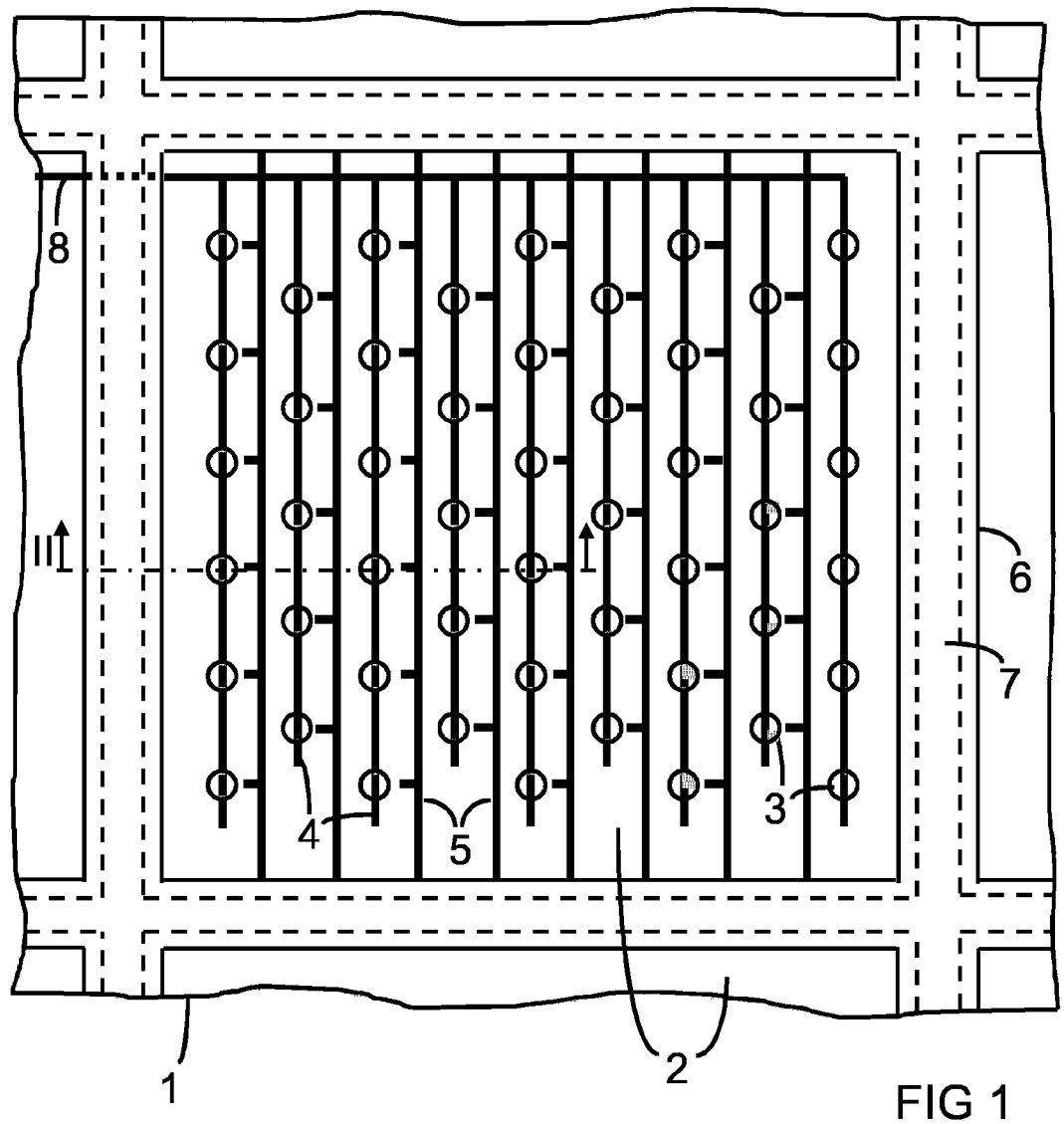
FIG. 1 shows a top view of a section of the photodiode device including one pixel.

FIG. 1 is a top view of the photodiode device without covering dielectric. Hidden contours are represented by broken lines. The substrate 1 comprises a semiconductor material like silicon, for instance. A doped surface region 2 occupies the entire surface except for the areas of doped wells 3, which are formed at the upper surface of the substrate 1 and are spaced apart from one another. Thus an arrangement of insulation regions, like shallow trench isolations or field oxide regions, is avoided.

The number of doped wells 3 is arbitrary as well as their arrangement. The arrangement shown in FIG. 1 is only an example of a suitable pattern. The distances between the doped wells 3 and their shapes can also be modified and adjusted to the requirements of individual embodiments. The doped surface region 2 and the doped wells 3 have opposite types of conductivity.

The doped wells 3 are electrically connected by means of conductor tracks 4. Further conductor tracks 5 are arranged separate from the conductor tracks 4. The further conductor tracks 5 are electrically connected to semiconductor material of the same type of conductivity as the doped surface region 2 and may especially be electrically connected to the doped surface region 2. Instead, the electric potential of the doped surface region 2 may be left floating. The conductor tracks 4 and the further conductor tracks 5 may be parallel and in alternating sequence, as shown in FIG. 1 by way of example.

A plurality of doped wells 3 is provided for one pixel, which may be a pixel of an array of pixels intended for image detection. This plurality of doped wells 3 is surrounded by a guard ring 7, which does not divide or intersect the area where the plurality of doped wells 3 is arranged. The guard ring 7 may at least partially comprise the same type of conductivity as the doped surface region 2.

A metal layer 6 is optionally arranged above and along the guard ring 7. The metal layer 6 may be provided as a common electric terminal for the further conductor tracks 5, as shown in FIG. 1 by way of example. A peripheral conductor track 8 may similarly be provided as a common electric terminal of the conductor tracks 4. The peripheral conductor track 8 can be connected to a control or read-out circuit on the periphery of the array of pixels and thus provides a separate electric terminal of the pixel in question.

Figure 2:
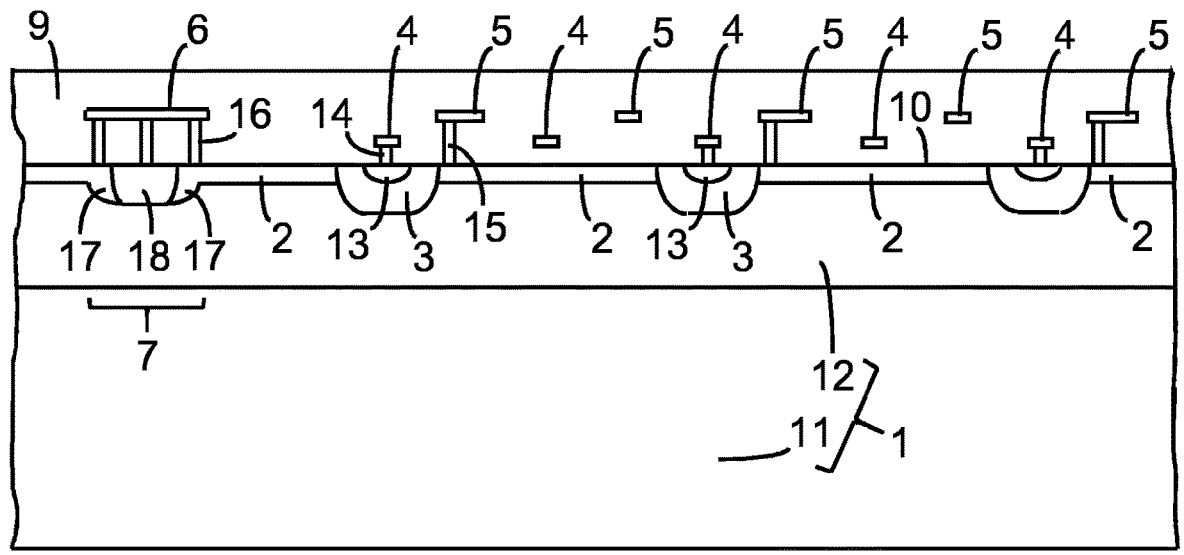
FIG. 2 shows the cross section indicated in FIG. 1.

FIG. 2 shows the cross section indicated in FIG. 1. In FIGS. 1 and 2, corresponding elements carry the same reference numeral. In FIG. 1 the substrate 1 is shown to comprise a semiconductor body 11, which is provided with an optional epilayer 12 forming the main surface 10. If the epilayer 12 is epitaxially grown, it has essentially the same crystalline structure as the semiconductor body 11. The epilayer 12 is doped for the type of conductivity that is opposite to the type of conductivity of the doped wells 3. The semiconductor body 11 may be undoped or intrinsically doped, or it may be doped for the same type of conductivity as the epilayer 12. If the substrate 1 does not comprise an epilayer, it is optionally doped for the type of conductivity opposite to the type of conductivity of the doped wells 3.

FIG. 2 shows that the doped surface region 2 covers the entire area of the main surface 10 between the doped wells 3 and the guard ring 7. The doped surface region 2 has a doping concentration that is higher than the doping concentration of the substrate 1 and in particular the doping concentration of the epilayer 12.

The conductor tracks 4 and the further conductor tracks 5 may be embedded in a dielectric 9, which is applied on or above the main surface 10. The dielectric 9 may be an intermetal dielectric like silicon oxide, which is generally used for wirings of CMOS devices, for instance. In the top view of FIG. 1, the substrate surface and the contours of the conductors arranged above the substrate surface are shown as if they were not hidden by the dielectric 9.

The conductor tracks 4 are electrically connected with the doped wells 3 by contact plugs 14, which are applied on contact regions 13 of the doped wells 3. The contact regions 13 comprise a doping concentration that is higher than the doping concentration of the doped wells 3 and thus enable the formation of ohmic contacts of the contact plugs 14 on the main surface 10 within the areas of the doped wells 3.

The further conductor tracks 5 may be electrically connected to the doped surface region 2 by further contact plugs 15. The relatively high doping concentration of the doped surface region 2 allows the formation of ohmic contacts. As shown in FIG. 2, the further contact plugs 15 may be arranged in the immediate vicinity of the doped wells 3, close to the pn-junctions that are formed between the doped wells 3 and the surrounding semiconductor material of the opposite type of conductivity.

FIG. 1 shows the further conductor tracks 5 having short branches located opposite the doped wells 3. These branches locally reduce the distance between the further conductor tracks 5 and the doped wells 3 without reducing the distance between the conductor tracks 4 and the parallel sections of the further conductor tracks 5. Thus the distance between a further conductor track 5 and the adjacent conductor tracks 4 can be made as large as possible without having to increase the distance between the contact plugs 14 and the further contact plugs 15. This may be desired in view of a low capacitance between the conductor tracks 4 and the further conductor tracks 5. Similar branches may instead or additionally be provided on the conductor tracks 4, which may in this case be arranged in positions that are laterally shifted from the positions above the centers of the doped wells 3.

FIG. 2 shows the conductor tracks 4 as portions of a structured lower metallization level, and the further conductor tracks 5 as portions of a structured higher metallization level. The level of the conductor tracks 4 may instead be higher than the level of the further conductor tracks 5, or the conductor tracks 4 and the further conductor tracks 5 may be formed in the same metallization layer. The further conductor tracks 5 may instead be applied directly on the doped surface region 2 in the area between the doped wells 3.

FIG. 2 shows the guard ring 7, which reduces cross-talk between neighboring pixels. In the example shown in FIG. 2, the guard ring 7 comprises an optional boundary region 17 and a core region 18. The boundary region 17 has the same type of conductivity as the doped surface region 2, and the core region 18 has the opposite type of conductivity. The optional metal layer 6, which may be provided above and along the guard ring 7, is electrically connected to both the boundary region 17 and the core region 18 by a plurality of contact plugs 16. The metal layer 6 can be provided for the entire pixel array as a common electric terminal of the further conductor tracks 5.

The doped wells 3 may especially have n-type conductivity, if the doped surface region 2 has p-type conductivity. In this case the conductor tracks 4 and the peripheral conductor track 8 are provided as a cathode terminal, and the further conductor tracks 5 and optionally the metal layer 6 are provided as an anode terminal. The types of conductivity can instead be reversed.

Figure 3:
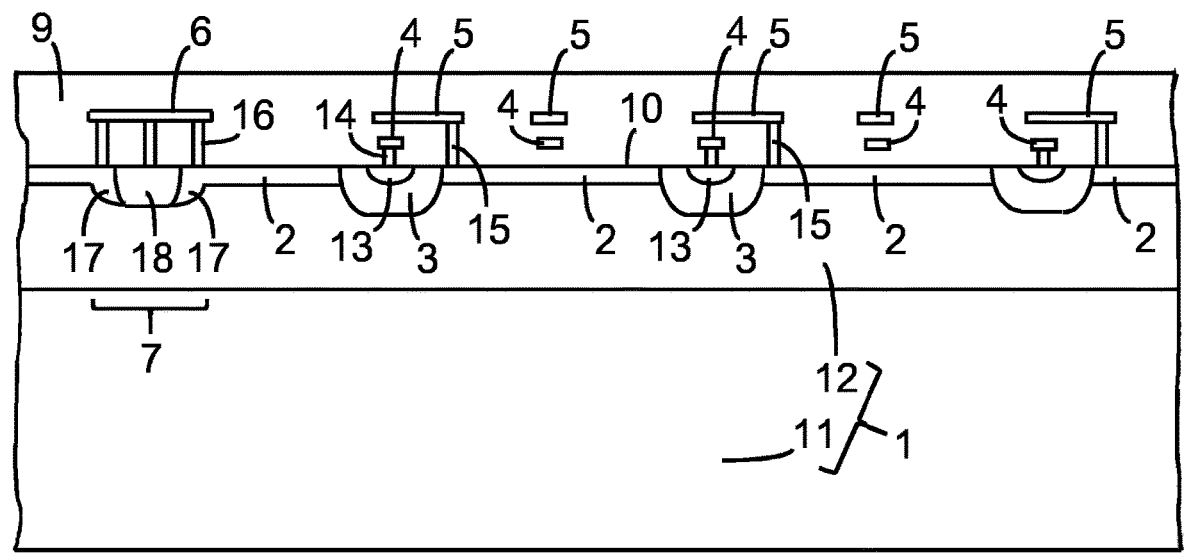
FIG. 3 is a cross section according to FIG. 2 for a further embodiment with different conductor track.

FIG. 3 is a cross section according to FIG. 2 for a further embodiment. Elements of the embodiment according to FIG. 3 that correspond to elements of the embodiment according to FIG. 2 are designated with the same reference numerals. In the embodiment according to FIG. 3, the further conductor tracks 5 are arranged above the conductor tracks 4. Hence there is no lateral distance between the conductor tracks 4 and the corresponding further conductor tracks 5. In the stacked arrangement according to FIG. 3, the conductor tracks 4 and the further conductor tracks 5 are formed in different metallization planes, which are isolated from one another by the dielectric 9. The stacked arrangement has the advantage that the area where incident radiation is shielded by the conductor tracks 4 and the further conductor tracks 5 is minimal. Furthermore, the stacked arrangement may be suitable in view of reducing the size of the device.

Figure 4:
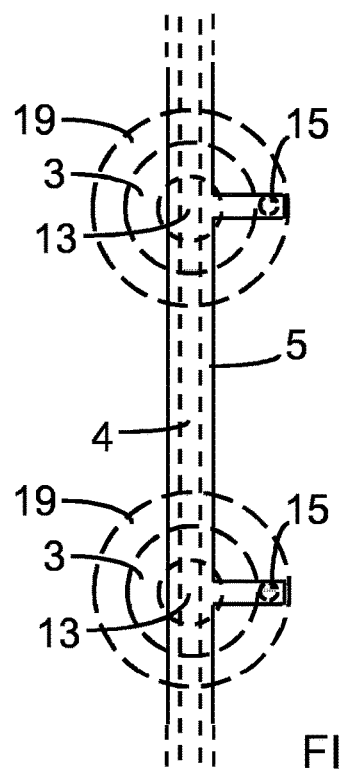
FIG. 4 is a top view of a section of the embodiment according to FIG. 3.

FIG. 4 is a top view of a section of the embodiment according to FIG. 3. FIG. 4 shows two of the doped wells 3 and the appertaining contact regions 13. The contours of these regions are indicated by broken lines. In the top view of FIG. 4, the further conductor track 5 covers the conductor track 4, which is therefore also represented by broken lines. The further conductor track 5 is provided with branches, which connect the further conductor track 5 with the further contact plugs 15. FIG. 4 also shows ring-shaped doped wells 19 laterally surrounding the doped wells 3, according to a further embodiment shown in FIG. 5.

Figure 5:
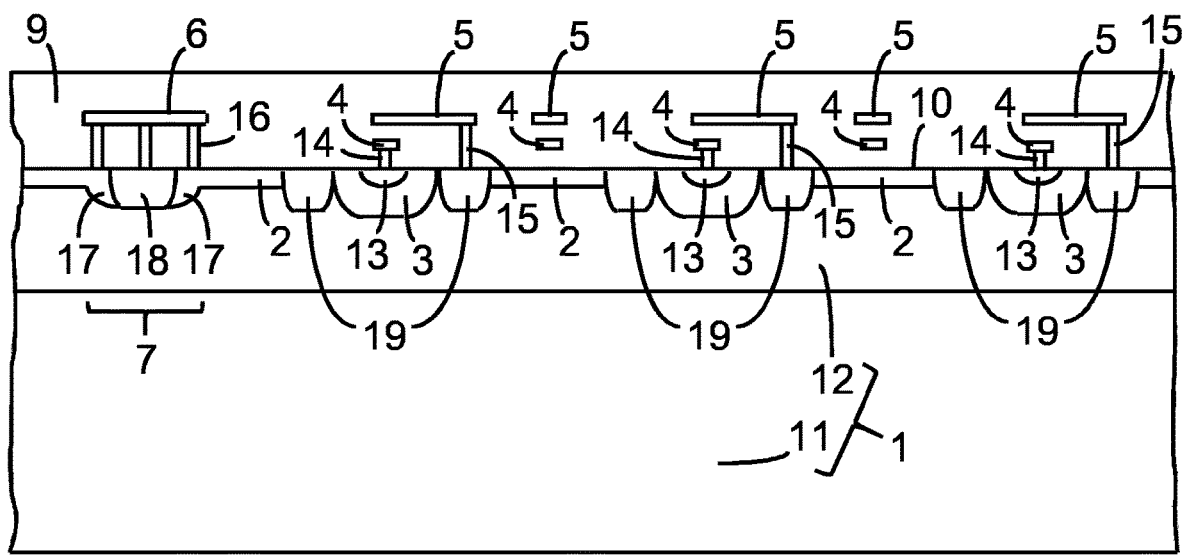
FIG. 5 is a cross section according to FIG. 2 for a further embodiment with a further doped well.

FIG. 5 is a cross section according to FIG. 2 for a further embodiment. Elements of the embodiment according to FIG. 5 that correspond to elements of the embodiment according to FIG. 2 are designated with the same reference numerals. In the embodiment according to FIG. 5, the doped wells 3 are laterally surrounded by ring-shaped doped wells 19, which are doped for the second type of conductivity and consequently have the same type of conductivity as the doped surface region 2. The ring-shaped doped wells 19 have the advantage that they reduce the capacitance of the photodiode. A low capacitance may in particular be favorable in view of improving the signal-to-noise ratio.

In the embodiment according to FIG. 5, the further conductor tracks 5 may be branched on either side, according to the embodiment shown in FIG. 2 or according to the embodiment shown in FIG. 3. FIG. 5 shows further conductor tracks 5 that are similar to the further conductor tracks 5 of the embodiment according to FIG. 3, by way of example.

A doping concentration of the semiconductor body of typically $10^{16}$ cm$^{-3}$ for CMOS devices is the cause of reduced dimension of the space charge region and thus of a relatively high capacitance. This is the main source of the so-called $k_B$T/C noise, where $k_B$ is the Boltzmann constant, T is the absolute temperature and C is the capacitance of the photodiode. The described photodiode device significantly reduces $k_B$T/C noise behavior by low junction capacitance, very low interconnection capacitance between photodiode and CMOS readout circuitry as compared to interconnections using wire bonds or through-silicon vias, and very short interconnection lengths. The doped surface region substantially enhances the response of the photodiode device without deteriorating or having adverse effects on the capacitance.

The described photodiode device comprises low capacitance, low leakage current, good spectral responsivity, radiation hardness, especially against x-rays at least in the range below 100 keV, as well as relatively short rise and fall times in combination with a low responsivity temperature coefficient. These features make this photodiode advantageous, in comparison to more complex three-dimensional photodiode structures, by providing higher yield at a lower price.

We claim:

1. A photodiode device, comprising:
   a substrate of semiconductor material with a main surface;
   a plurality of doped wells of a first type of conductivity, spaced apart at the main surface;
   a guard ring comprising a doped region of a second type of conductivity, which is opposite to the first type of conductivity;
   conductor tracks electrically connected with the doped wells, the conductor track interconnecting the doped wells;
   further conductor tracks electrically connected to a region of the second type of conductivity;
   contact regions arranged at the main surface within the doped wells;
   contact plugs connecting the conductor tracks with the contact regions;
   a doped surface region of the second type of conductivity being present at the main surface and covering the entire area between the guard ring and the doped wells; and
   further contact plugs arranged on the doped surface region and connected to the further conductor tracks,
   the guard ring surrounding an area of the main surface including the plurality of doped wells without dividing this area.

2. The photodiode device according to claim 1, wherein:
   the further conductor tracks are electrically connected with the doped surface region.

3. The photodiode device according to claim 1, further comprising:
   a boundary region of the guard ring, the boundary region comprising the second type of conductivity; and a core region of the guard ring arranged inside the boundary region, the core region comprising the first type of conductivity.

4. The photodiode device according to claim 3, further comprising:
a metal layer arranged along the guard ring; and
contact plugs of the metal layer contacting the guard ring, the further conductor tracks being connected to the metal layer.

5. The photodiode device according to claim 4, wherein:
the contact plugs of the metal layer contact the boundary region and the core region.

6. The photodiode device according to claim 1, wherein:
the conductor tracks and the further conductor tracks are arranged parallel to one another and in alternating sequence.

7. The photodiode device according to claim 1, wherein:
the contact regions have a doping concentration that is higher than the doping concentration of the doped wells.

8. The photodiode device according to claim 1, further comprising:
a peripheral conductor track, the conductor tracks being connected with the peripheral conductor track.

9. The photodiode device according to claim 8, wherein:
the first type of conductivity is n-type conductivity and the second type of conductivity is p-type conductivity;
the peripheral conductor track is provided as a cathode terminal; and
the further conductor tracks are provided as an anode terminal.

10. The photodiode device according to claim 1, further comprising:
a dielectric on or above the main surface, the conductor tracks and the further conductor tracks being embedded in the dielectric.

11. The photodiode device according to claim 1,
the substrate comprising a semiconductor body and an epilayer grown on the semiconductor body, the main surface being formed by a surface of the epilayer.

12. The photodiode device according to claim 11, wherein:
the epilayer is doped for the second type of conductivity;
the doped surface region is formed within the epilayer; and
the doped surface region has a doping concentration that is higher than the doping concentration of the epilayer.

13. The photodiode device according to claim 1, wherein:
the plurality of doped wells is provided for one pixel of an array of pixels, the pixels of the array being separated by the guard ring.

14. The photodiode device according to claim 13, wherein:
the conductor tracks are interconnected for each pixel separately; and
the further conductor tracks are interconnected for all pixels of the array in common.

15. The photodiode device according to claim 1, further comprising:
a plurality of ring-shaped doped wells of the second type of conductivity, each of the ring-shaped doped wells laterally surrounding one of the doped wells.

16. A photodiode device, comprising:
a substrate of semiconductor material with a main surface;
a plurality of doped wells of a first type of conductivity, spaced apart at the main surface;
a guard ring comprising a doped region of a second type of conductivity, which is opposite to the first type of conductivity;
conductor tracks electrically connected with the doped wells, the conductor tracks interconnecting the doped wells;
further conductor tracks electrically connected to a region of the second type of conductivity;
contact regions arranged at the main surface within the doped wells;
contact plugs connecting the conductor tracks with the contact regions;
a doped surface region of the second type of conductivity being present at the main surface and covering the entire area between the guard ring and the doped wells; and
further contact plugs arranged on the doped surface region and connected to the further conductor tracks, the further contact plugs being arranged in the vicinity of the doped wells,
each distance between one of the contact plugs and the further contact plug that is nearest to said contact plug being smaller than the distance between the conductor track connected with said contact plug and the further conductor track connected with said further contact plug, and
the guard ring surrounding an area of the main surface including the plurality of doped wells without dividing this area.

* * * * *